United States Patent
Ahn et al.

(10) Patent No.: US 9,293,209 B2
(45) Date of Patent: Mar. 22, 2016

(54) SEMICONDUCTOR MEMORY DEVICE PERFORMING READ RETRY MODE AND OPERATING METHOD OF THE SAME

(71) Applicant: SK hynix Inc., Gyeonggi-do (KR)

(72) Inventors: Jung Ryul Ahn, Gyeonggi-do (KR); Seung Hwan Baik, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 351 days.

(21) Appl. No.: 13/799,523

(22) Filed: Mar. 13, 2013

(65) Prior Publication Data

US 2014/0063967 A1   Mar. 6, 2014

(30) Foreign Application Priority Data

Aug. 29, 2012   (KR) ........................ 10-2012-0095047

(51) Int. Cl.
*G11C 16/06* (2006.01)
*G11C 16/04* (2006.01)
*G11C 16/26* (2006.01)

(52) U.S. Cl.
CPC ...................................... *G11C 16/26* (2013.01)

(58) Field of Classification Search
CPC .... G11C 16/04; G11C 16/0483; G11C 16/10; G11C 16/12; G11C 16/26; G11C 11/5628; G11C 11/5642

USPC ............... 365/185.09, 185.2, 185.17, 185.19, 365/185.22, 185.18
See application file for complete search history.

(56) References Cited

U.S. PATENT DOCUMENTS

2004/0202037 A1* 10/2004 Kawai .................... G11C 16/20 365/232
2008/0253191 A1* 10/2008 Kang .................... G11C 16/20 365/185.18

FOREIGN PATENT DOCUMENTS

KR            100859258      9/2008
KR         1020100016761     2/2010

* cited by examiner

*Primary Examiner* — Tha-O H Bui
(74) *Attorney, Agent, or Firm* — IP & T Group LLP (57) ABSTRACT

An operating method of a semiconductor memory device includes performing a first read operation on main cells of a first page with an initial read voltage, performing a second read operation on the main cells of the first page with a read voltage corresponding to a read retry number when the number of error bits generated as results of performing the first read operation exceeds the number of error-correctable bits, and storing the read retry number in spare cells of the first page while the second read operation is performed, and repeatedly performing the second read operation and repeatedly storing the read retry number until the number of error bits generated as results of performing the second read operation becomes the number of error-correctable bits or less.

20 Claims, 8 Drawing Sheets

SEMICONDUCTOR MEMORY DEVICE PERFORMING READ RETRY MODE AND OPERATING METHOD OF THE SAME

CROSS-REFERENCE TO RELATED APPLICATION

This application claims priority to and the benefit of Korean Patent Application No. 10-2012-0095047, filed Aug. 29, 2012, the disclosure of which is incorporated herein by reference in its entirety.

BACKGROUND

1. Field of the Invention

Exemplary embodiments of the present invention relate to a semiconductor design technology, and more particularly, to a semiconductor memory device that performs a program operation and a read operation and an operating method of the semiconductor memory device.

2. Discussion of Related Art

In general, a semiconductor memory device, such as a flash memory device, performs a program/erase operation to store data in a memory cell, and performs a read operation to output the stored data.

The program operation causes an increase in a threshold voltage of the memory cell. When a high voltage is supplied to a control gate during the program operation, electrons are injected into a floating gate by Fowler-Nordheim (FN) tunneling, and the threshold voltage of the memory cell increases. Repeated program/erase operations on the memory cell may cause the electrons injected into the floating gate to be trapped in a tunnel oxide layer. For this reason, an increase in cycling number may cause an increase in the programming speed of memory cells.

Figure 1:
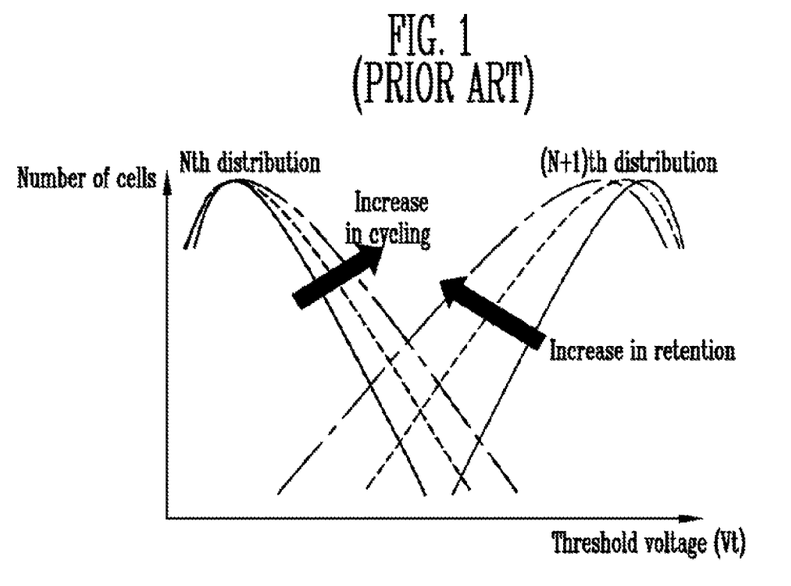
FIG. 1 is a diagram illustrating a variation in a distribution of threshold voltages of memory cells caused by increases in cycling and retention numbers.

It may be seen from FIG. 1 that the greater the cycling number, the wider the right portion of $N^{th}$ distribution.

Meanwhile, particularly in a NAND flash memory among semiconductor memory devices, stored data should be maintained for a long time (e.g., 10 years or more) even when powers are turned off, which is referred to as reliability. As the flash memory is highly integrated, the size of a memory cell decreases, and an interval between respective distributions becomes very narrow. The narrow interval requires accurate adjustment of the number of the electrons stored in a floating gate, and prevention of electron loss over time for the reliability. However, since the size of the memory cell decreases and the number of the electrons stored in the memory cell is reduced, the loss of the electrons has a strong influence on distributions. The electrons denote negative charge, and the loss of the electrons moves distributions to the left.

It may be seen from FIG. 1 that the greater the retention number, the wider the left portion of $(N+1)^{th}$ distribution.

For this reason, there may be a concern regarding an overlap between the left side cells of the reference distribution (e.g., $(N+1)^{th}$ distribution) and the right side cells of the distribution (e.g., $(N)^{th}$ distribution) immediately below the reference distribution.

SUMMARY OF THE INVENTION

Exemplary embodiments of the present invention are directed to reduce time required for a read operation of a semiconductor memory device and improving the reliability of data.

One aspect of the present invention provides an operating method of a semiconductor memory device including performing a first read operation on main cells of a first page with an initial read voltage, performing a second read operation on the main cells of the first page with a read voltage corresponding to a read retry number when the number of error bits generated as results of performing the first read operation exceeds the number of error-correctable bits, and storing the read retry number in spare cells of the first page while the second read operation is performed, and repeatedly performing the second read operation and repeatedly storing the read retry number until the number of error bits generated as results of performing the second read operation becomes the number of error-correctable bits or less.

Another aspect of the present invention provides an operating method of a semiconductor memory device including performing a read operation on spare cells of a first page with a reference read voltage to read a read retry number from the spare cells, performing a read operation on main cells of the first page with a first read voltage determined based on the read retry number to read data from the main cells, updating the read retry number when a number of error bits of the data exceeds a number of error-correctable bits, and performing a read operation on the main cells of the first page with a second read voltage determined according to the updated read retry number to read the data from the main cells.

Still another aspect of the present invention provides a semiconductor memory device including a memory array including main cells for storing data and spare cells for storing a read retry number, a page buffer configured to read the data or the read retry number, an error corrector configured to correct an error of the read data, and a voltage supplier configured to supply a read voltage set based on the read retry number to the memory array, wherein when the error corrector determines that the read data is failed, the voltage supplier updates the read retry number to reset the read voltage, and the page buffer stores the updated read retry number in the spare cells.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIG. 7A to FIG. 7C are flowcharts illustrating operating methods of a semiconductor memory device according to various exemplary embodiments of the present invention;

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
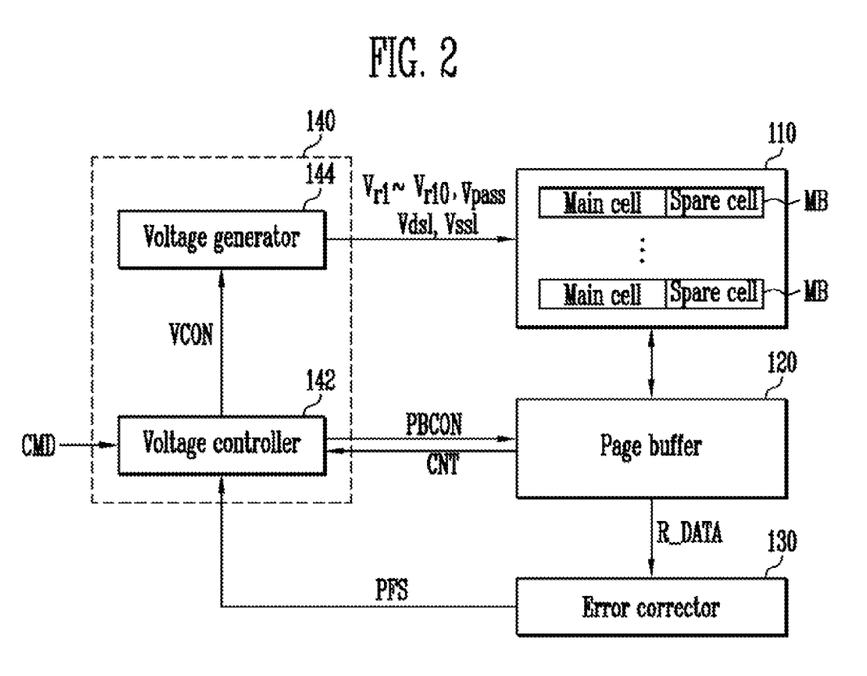
FIG. 2 is block diagram illustrating a semiconductor memory device according to exemplary embodiments of the present invention.
Figure 3:
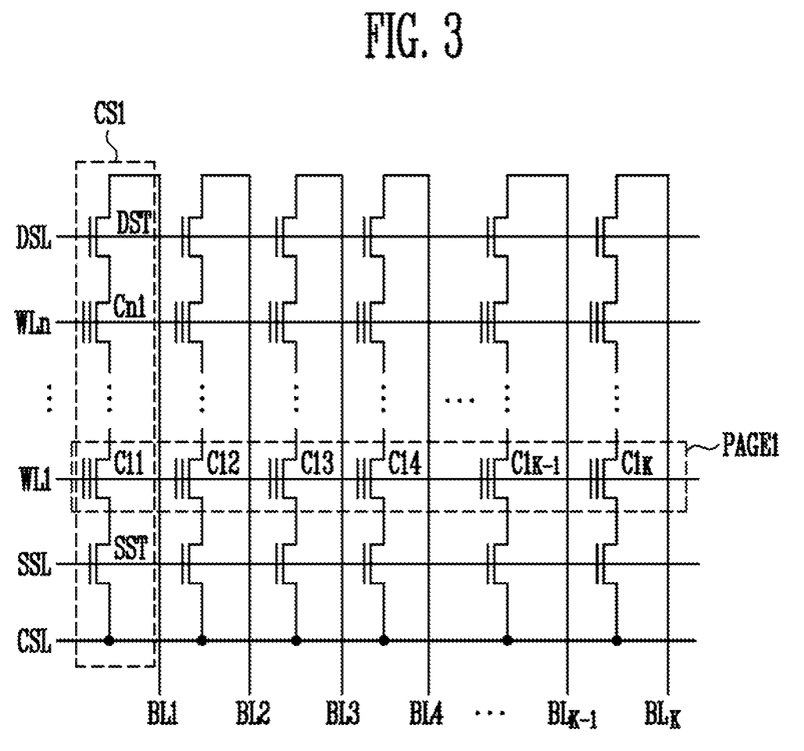
FIG. 3 is a circuit diagram illustrating a memory block shown in FIG. 2.

FIG. 2 is block diagram for explaining a semiconductor memory device according to exemplary embodiments of the present invention. FIG. 3 is a circuit diagram of a memory block (MB) shown in FIG. 2.

The semiconductor memory device includes a memory array 110 including a plurality of memory blocks MBs, and an operation circuit configured to perform a program operation, a read operation, and an error correction operation on memory cells included in a selected page of a memory block MB. The operation circuit may include a page buffer 120, an error corrector 130, and a voltage supplier 140.

Referring to FIG. 3, each memory block MB includes a plurality of cell strings connected between a common source line CSL and each of bit lines BL1 to BLk. In other words, the plurality of cell strings are connected with the corresponding bit lines BL1 to BLk respectively, and connected in common with the common source line CSL. Each cell string CS1 includes a source select transistor SST, which has a source connected with the common source line CSL, a plurality of memory cells (or cell transistors) C11 to Cn1, and a drain select transistor DST, which has a drain connected with the respective bit line BLS. The memory cells C11 to Cn1 are connected in series between the select transistors SST and the drain select transistor DST. A gate of the source select transistor SST is connected with a source select line SSL, gates of the memory cells C11 to Cn1 are connected with word lines WL1 to WLn, respectively, and a gate of the drain select transistor DST is connected with a drain select line DSL.

In a NAND flash memory device, memory cells included in a memory block MB may be classified in page units. For example, memory cells C11 to C1k connected with one word line WL1 constitute one page PAGE1. Such a page is a basic unit of a program operation or a read operation. The memory cells C11 to C1k constituting the one page PAGE1 may be classified into main cells and spare cells (or flag cells). The main cells are intended to store general data, and the spare cells are intended to store state information about a memory device, and so on. In exemplary embodiments of the invention, information about a read retry number of the main cells may be stored in the spare cells.

Referring back to FIG. 2, the voltage supplier 140 includes a voltage controller 142 and a voltage generator 144. The voltage controller 142 outputs a control signal VCON for controlling the voltage generator 144 and a control signal PBCON for controlling the page buffer 120 in response to a command signal CMD input from the outside through an input/output (I/O) circuit (not illustrated). The voltage controller 142 sets a read voltage based on a read retry number, and outputs the control signal VCON such that the voltage generator 144 generates the set read voltage. Also, when an error of data read from the page buffer 120 may not be fixed, the voltage controller 142 updates the read retry number.

In response to the control signal VCON of the voltage controller 142, the voltage generator 144 supplies operating voltages (e.g., Vr1 to Vr10, Vpass, Vdsl, and Vssl) required for a read operation for memory cells to local lines of a selected memory block MB including a drain select line DSL, word lines WL0 to WLn, and a source select line SSL. The voltage generator 144 supplies read voltages Vr1 to Vr10 to be supplied to memory cells of a selected page and a pass voltage Vpass to be supplied to unselected memory cells to the local lines.

In response to the control signal PBCON of the voltage controller 142, the page buffer 120 selectively precharges the bit lines BL1 to BLk according to input data so as to store the data in the memory cells C11 to Cnk, or senses voltages of the bit lines BL1 to BLk so as to read data from the memory cells C11 to Cnk.

For example, in a read operation, the page buffer 120 precharges the bit lines BL1 to BLk. When the read voltages Vr1 to Vr10 are supplied from the voltage generator 144 to a selected word line WL1, bit lines of main cells in which program data is stored are kept in a precharge state, and bit lines of main cells in which erasing data is stored are discharged. The page buffer 120 senses a voltage change of the bit lines BL1 to BLk, and latches data of the main cells as the sensing results. The page buffer 120 outputs the data R_DATA read from the main cells to the error corrector 130. In particular, when the semiconductor memory device is powered on, the page buffer 120 may read a read retry number stored in the spare cells and output number information CNT to the voltage controller 142. Also, the page buffer 120 may store an updated read retry number in the spare cells while reading data from the main cells with a read voltage reset by the voltage controller 142.

The error corrector 130 performs an error correction algorithm. Through the error correction algorithm, the error corrector 130 corrects an error of the data R_DATA read from the main cells by the page buffer 120, and outputs a result signal PFS to the voltage controller 142. Specifically, when the number of error bits of the read data R_DATA exceeds the number of correctable bits, the error corrector 130 may output a fail signal to the voltage controller 142. In response to the fail signal, the voltage controller 142 may update the read retry number.

An operating method of the semiconductor memory device having the above-described parts will be described below.

Figure 4:
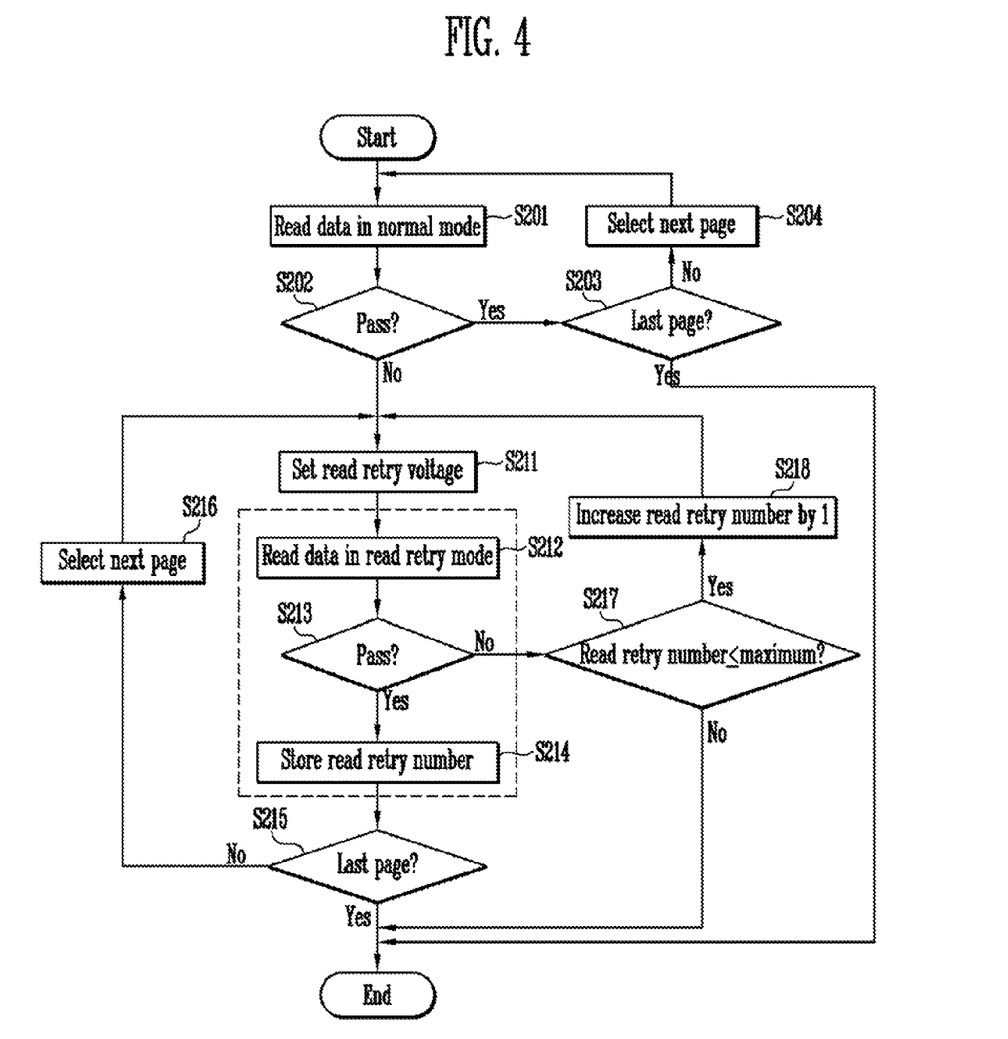
FIG. 4 is a flowchart illustrating an operating method of a semiconductor memory device according to an exemplary embodiment of the present invention.

FIG. 4 is a flowchart illustrating an operating method of a semiconductor memory device according to a first exemplary embodiment of the present invention.

Referring to FIG. 4, first, a read operation is performed in a normal mode (S201).

It is checked whether the number of error bits of data read as the results of performing the read operation in the normal mode is the number of error-correctable bits or less (S202).

When the number of error bits of the read data is the number of error-correctable bits or less, it is determined that the read operation is passed. In this case, it is checked whether a page on which the current read operation is performed is the last page (S203). When the page is the last page, the operation is finished. On the other hand, when the page is not the last page, the next page is selected (S204), and a read operation is performed again in the normal mode (S201).

Meanwhile, when the number of error bits of the read data exceeds the number of error-correctable bits, it is determined that the read operation is failed. In this case, a read retry operation is performed. The read retry operation is an operation of changing a read voltage and performing the read operation again when a read operation fails.

To perform the read retry operation, a read retry voltage is set (S211). A read retry number is read from spare cells of a memory array. Then, the read retry voltage is set based on the read retry number.

Next, a read operation is performed in a read retry mode (S212).

It is checked whether the number of error bits of data read as the results of performing the read operation in the read retry mode is the number of error-correctable bits or less (S213).

When the number of error bits of the read data is the number of error-correctable bits or less, it is determined that the read operation is passed, and a read retry number is stored (S214).

Next, it is checked whether the page on which the current read operation is performed is the last page (S215). When the page is the last page, the operation is finished. On the other hand, when the page is not the last page, the next page is selected (S216), and the read retry voltage is set again (S211).

Meanwhile, when the number of error bits of the read data exceeds the number of error-correctable bits, it is determined that the read operation is failed, and then it is checked whether the current read retry number is at a maximum retry number or less (S217).

When the current read retry number is at the maximum retry number or less, the read retry number is increased by 1 (S218). Then, the read retry voltage is set based on the increased read retry number (S211). On the other hand, when the current read retry number exceeds the maximum retry number, it may be impossible to perform the read retry operation any longer, and the operation is finished.

The read retry operation will be described in further detail below.

TABLE 1

| Page No. | Results of Performing Read Operation | Comments |
| --- | --- | --- |
| 1 | Normal read operation is passed | |
| 2 | Normal read operation is passed | |
| 3 | Normal read operation is failed →Perform read retry operation | Vr1 → Vr2 → Vr3 (Pass) Set Vr3 as initial read voltage |
| 4 | Read retry operation is passed with Vr3 | |
| 5 | Read retry operation is passed with Vr3 | |
| 6 | Read retry operation is failed with Vr3 | Vr3 → Vr4 → Vr5 → Vr6 → Vr7 (Pass) |

TABLE 1-continued

| Page No. | Results of Performing Read Operation | Comments |
| --- | --- | --- |
| | | Set Vr7 as initial read voltage |
| 7 | Read retry operation is passed with Vr7 | |
| 8 | Read retry operation is passed with Vr7 | |
| 9 | Read retry operation is failed with Vr7 | Vr7 → Vr8 → Vr9 → Vr10 → Vr1 (Pass) Set Vr1 as initial read voltage |
| 10 | Read retry operation is passed with Vr1 | |
| ... | ... | ... |

As described above, the read retry operation is an operation of, when the normal read operation fails with the set read voltage, performing the read operation again with modified read voltage. In the embodiment of the invention, the read retry operation may be performed with the first to tenth read voltages Vr1 to Vr10. The number of read voltages with which the read retry operation will be performed may be adjusted.

Referring to Table 1, when a normal read operation fails, a read retry operation is performed ($3^{rd}$ page). First, the read operation is performed with the first read voltage Vr1. When the read operation is failed, the read operation is performed with the second read voltage Vr2. When the read operation is failed again, the read operation is performed with the third read voltage Vr3. When the read operation is passed, the third read voltage Vr3 is set as an initial read voltage for performing a read operation on the next page. In other words, a read retry operation is performed on a $4^{th}$ page and the subsequent pages using the third read voltage Vr3 as an initial voltage.

When the read operation with the third read voltage Vr3 is failed ($6^{th}$ page), the read operation is performed with the fourth read voltage Vr4. When the read operation is failed, the read operation is performed with the fifth read voltage Vr5. When the read operation is failed, the read operation is performed with the sixth read voltage Vr6. When the read operation is failed, the read operation is performed with the seventh read voltage Vr7. When the read operation is passed, the seventh read voltage Vr7 is set as an initial read voltage for performing a read operation on the next page. In other words, a read retry operation is performed on a $7^{th}$ page and the subsequent pages using the seventh read voltage Vr7 as an initial voltage.

When the read operation with the seventh read voltage Vr7 is failed ($9^{th}$ page), the read operation is performed with the eighth read voltage Vr8. When the read operation is failed, the read operation is performed with the ninth read voltage Vr9. When the read operation is failed, the read operation is performed with the tenth read voltage Vr10. When the read operation is failed, the read operation is performed again with the first read voltage Vr1. This is because the tenth read voltage Vr10 is the last read voltage. When the read operation is passed, the first read voltage Vr1 is set as an initial read voltage for performing a read operation on the next page. In other words, a read retry operation is performed on a $10^{th}$ page and the subsequent pages using the first read voltage Vr1 as an initial voltage.

By performing a read retry operation in this way, lengthening of read operation time due to read failure may be prevented. In particular, a read retry number may be stored in spare cells of a memory array and then read before a read operation is performed, and the read operation may be performed with a read voltage based on the read retry number.

Thus, even when power is off, a read operation may be performed with a read voltage that is passed in advance rather than an initial read voltage.

Figure 5:
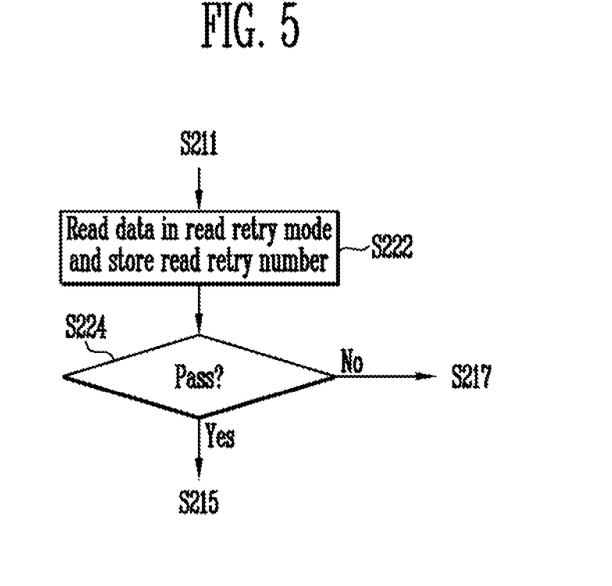
FIG. 5 is a flowchart illustrating an operating method of a semiconductor memory device according to an exemplary embodiment of the present invention.

FIG. 5 is a flowchart illustrating an operating method of a semiconductor memory device according to a second exemplary embodiment of the present invention.

Referring to FIG. 5, in the operating method of semiconductor memory device according to the second exemplary embodiment of the present invention, a read retry voltage is set as in the step S211 of FIG. 4.

Then, a read retry number is stored while a read operation is performed in the read retry mode (S222).

Next, it is checked whether the number of error bits of data read as the results of performing the read operation in the read retry mode is the number of error-correctable bits or less (S224).

When the number of error bits of the read data is the number of error-correctable bits or less, it is determined that the read operation is passed, and the process proceeds to the step S215 of FIG. 4.

Meanwhile, when the number of error bits of the read data exceeds the number of error-correctable bits, it is determined that the read operation is failed, and the process proceeds to the step S217 of FIG. 4.

In the second exemplary embodiment of the present invention, a read retry number is stored while a read retry operation is performed, unlike in the first exemplary embodiment. This is the same as programming data in a memory cell while reading data from another memory cell. In this way, time required for a read operation may be further reduced.

Specifically, a read retry number is stored in spare cells while data is read from main cells of a memory array.

Referring back to Table 1, when a normal read operation is failed, a read retry operation is performed ($3^{rd}$ page). A read retry number "1" is stored in spare cells while data is read from main cells with the first read voltage Vr1. When the read operation is failed, a read retry number "2" is stored the spare cells while data is read from the main cells with the second read voltage Vr2. When the read operation is failed again, a read retry number "3" is stored in the spare cells while data is read from the main cells with the third read voltage Vr3. When the read operation is passed, the read retry number "3" is stored in the spare cells. When a read retry operation is performed on the $4^{th}$ page, the read retry number "3" stored in the spare cells may be read, and the read retry operation may be performed with the third read voltage Vr3. In the exemplary embodiment an operation of reading the read retry number stored in the spare cells may be performed first when the semiconductor memory device is powered on.

To store a read retry number in spare cells while reading data from main cells, a hot carrier injection method may be used.

Figure 6:
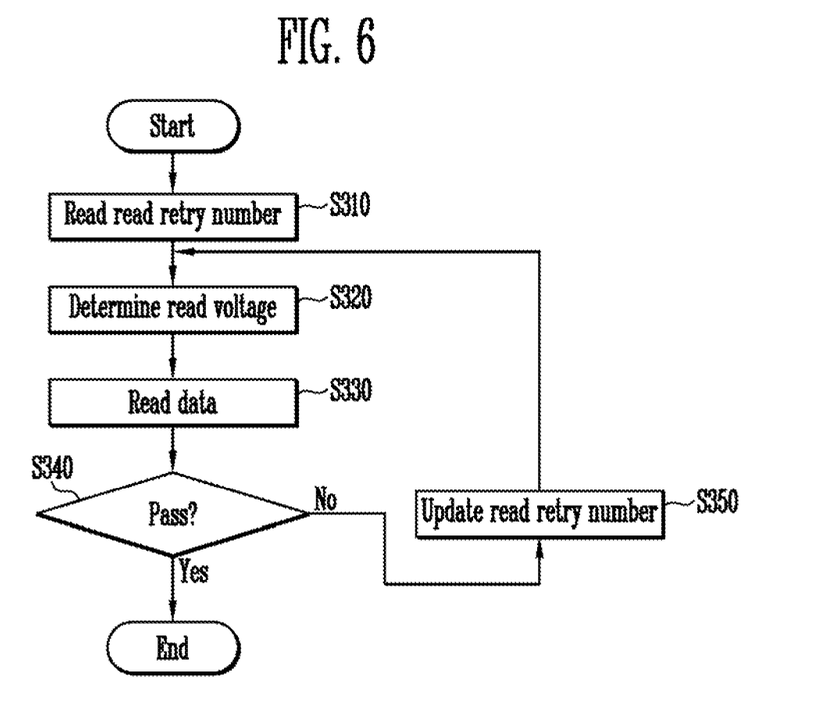
FIG. 6 is a flowchart illustrating an operating method of a semiconductor memory device according to an exemplary embodiment of the present invention.

FIG. 6 is a flowchart illustrating an operating method of a semiconductor memory device according to a third exemplary embodiment of the present invention.

Referring to FIG. 6, in the operating method of semiconductor memory device according to the third exemplary embodiment of the present invention, a read operation is first performed on spare cells of a first page with a reference read voltage to read a read retry number from the spare cells (S310). The reference read voltage may be a read voltage for distinguishing between "0" data and "1" data in a single-level cell (SLC) read operation.

After that, a read voltage is determined based on the read retry number (S320), and a read operation is performed on main cells of the first page with the determined read voltage to read data from the main cells (S330).

Then, it is checked whether the read operation is passed on the basis of the number of error bits of the data (S340). When the number of error bits of the data exceeds the number of error-correctable bits, the read retry number is updated (S350), and the process proceeds back to the step S320 to determine a read voltage according to the updated read retry number and perform a read operation on the main cells with the determined read voltage, thereby reading data from the main cells.

Meanwhile, when the number of error bits of the data is the number of error-correctable bits or less, it is determined that the read operation is passed. Then the process may be finished.

Figure 7A:
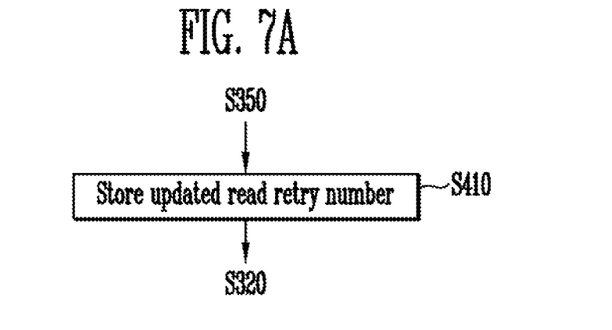
Figure 7B:
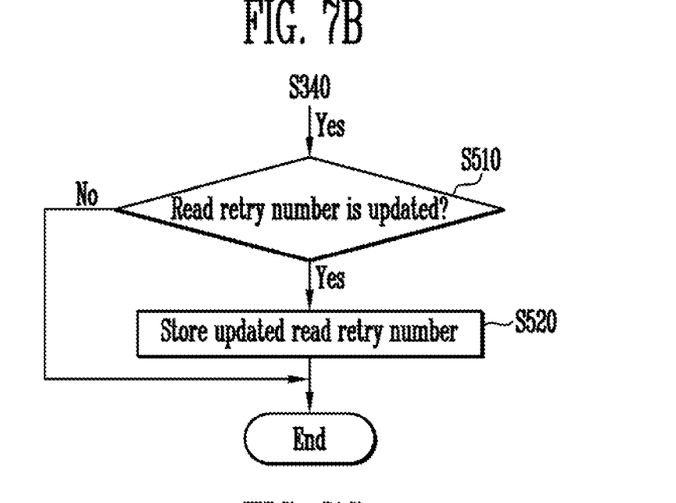
Figure 7C:
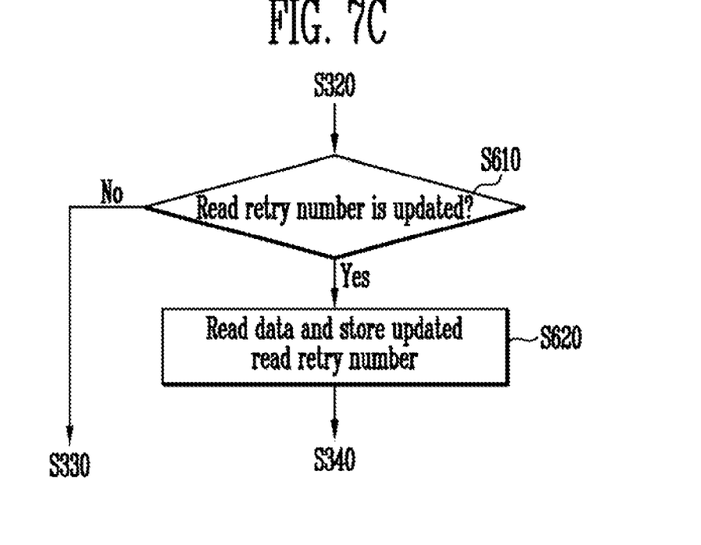

FIG. 7A to FIG. 7C are flowcharts illustrating operating methods of a semiconductor memory device according to fourth to sixth exemplary embodiments of the present invention.

Referring to FIG. 7A, in the operating method of a semiconductor memory device according to the fourth exemplary embodiment of the present invention, after the read retry number is updated in the step S350 of FIG. 6, the updated read retry number is stored (S410). Then, the process proceeds back to the step S320 of FIG. 6. Here, the updated read retry number may be stored in the spare cells.

Referring to FIG. 7B, in the operating method of a semiconductor memory device according to the fifth exemplary embodiment of the present invention, when it is determined in the step S340 of FIG. 6 that the number of error bits of the data is the number of error-correctable bits or less, it is checked whether the read retry number is updated (S510). When the read retry number is updated, the updated read retry number is stored (S520), and then the process may be finished. Also, when the read retry number is not updated, the process may be finished. In the operating method of a semiconductor memory device according to the fifth exemplary embodiment of the present invention, the updated read retry number is not stored each time a read retry number is updated, unlike in the fourth embodiment, and a read retry number finally updated by repeatedly performing the step S320 to S350 of FIG. 6 is stored. Here, the updated read retry number may be stored in the spare cells. Thus, time required to store updated read retry numbers may be reduced.

Referring to FIG. 7C, in the operating method of a semiconductor memory device according to the sixth exemplary embodiment of the present invention, after the step S320 of FIG. 6, it is checked whether the read retry number is updated (S610). When the read retry number is updated, the updated read retry number is stored in spare cells while a read operation is performed on main cells to read data from the main cells (S620). After that, the process proceeds to the step S340 of FIG. 6. Thus, it may be possible to reduce time required for the overall operation. When the read retry number is not updated, the process proceeds to the step S330 of FIG. 6.

Figure 8:
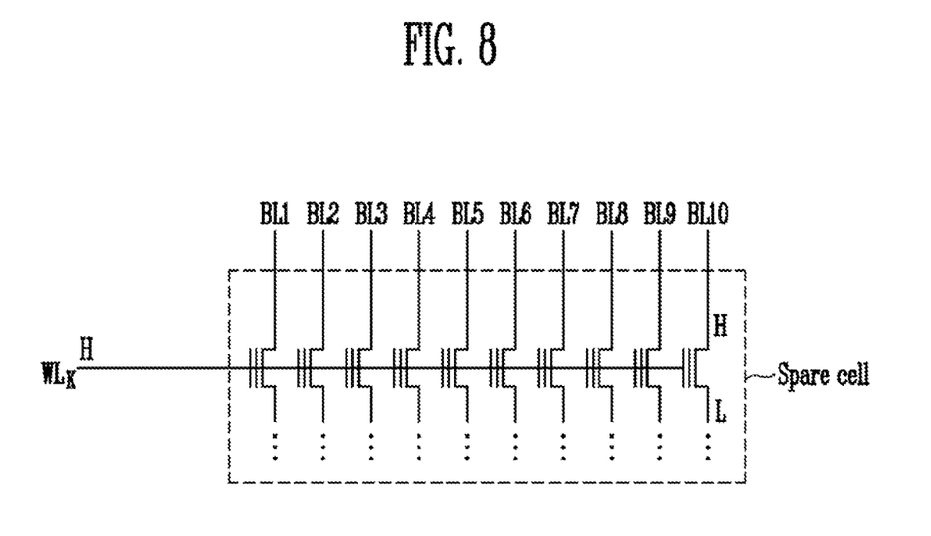
FIG. 8 is a circuit diagram illustrating an operation of storing a read retry number using a hot carrier injection method.

FIG. 8 is a circuit diagram illustrating an operation of storing a read retry number using the hot carrier injection method.

When a high voltage is supplied to a drain of a memory cell with a source discharged, hot carriers are generated and move toward the drain. At this time, when a high voltage is supplied to a control gate, the hot carriers are trapped in the floating gate of the memory cell, and data is programmed.

Referring to FIG. 8, a read voltage is supplied to a selected word line WLk upon a read operation. At this time, data stored in main cells may be read according to whether or not bit lines of the main cells are kept at a precharge level. Meanwhile, spare cells are also connected with the same word line WLk as the main cells, and thus the read voltage is supplied to a control gate of the spare cells upon the read operation. At this time, a bit line voltage level of the spare cells may be adjusted to store a read retry number in the spare cells.

For example, when a read retry number "1" is stored, a high voltage is supplied to a tenth bit line BL10, thereby programming a spare cell connected with the tenth bit line BL10. When a read retry number "2" is stored, the high voltage is supplied to a ninth bit line BL9, thereby programming a spare cell connected with the ninth bit line BL9. Since the two spare cells are programmed, the read retry number "2" may be read by reading the spare cells.

For example, a read retry number may be stored in the spare cells with a voltage ranging from 4 to 15 V using the hot carrier injection method, and may be read from the spare cells with a voltage ranging from 0.1 to 14.9 V.

In this way, a read retry number may be stored in spare cells while a read operation is performed on main cells. Thus, time required for a read operation may be further reduced.

In the aforementioned exemplary embodiments, the number of programmed spare cells may be used, but a read retry number may be also stored using whether or not spare cells are programmed. For example, when a read retry number is "2," the spare cell connected with the ninth bit line BL9 is programmed, but the spare cell connected with the tenth bit line BL10 is not programmed. When a read retry number is "3," the spare cells connected with the ninth bit line BL9 and the tenth bit line BL10 are programmed. In this way, the number of required spare cells may be reduced.

Figure 9:
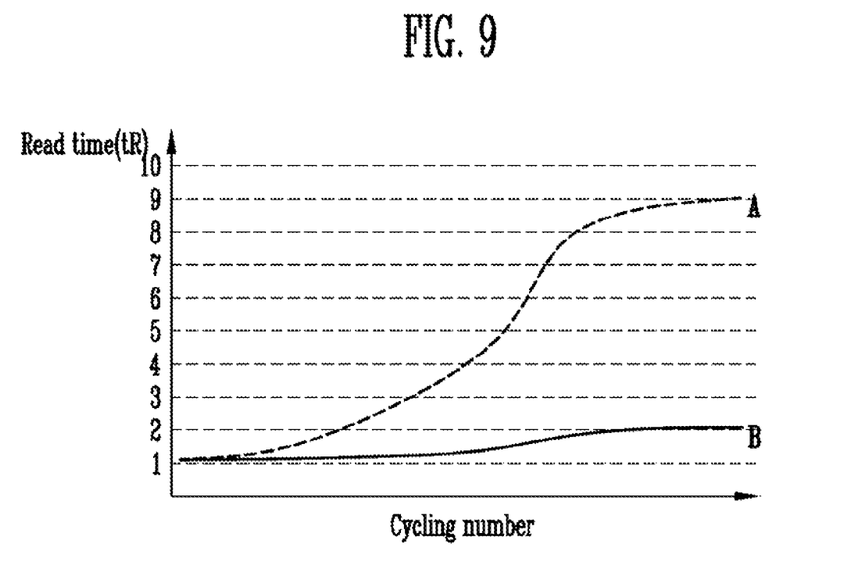
FIG. 9 is a graph illustrating a read time reduction effect obtained by performing an operating method of a semiconductor memory device according to an exemplary embodiment of the present invention.

FIG. 9 is a graph illustrating a read time reduction effect obtained by performing an operating method of a semiconductor memory device according to an exemplary embodiment of the present invention.

Referring to FIG. 9, it may be seen from a case A that time required for a read operation increases 9 times with an increase in cycling number for the case of a related method.

However, it may be seen from a case B that time required for a read operation only slightly increases even with an increase in cycling number for the case of an operating method of the exemplary embodiment of the present invention.

Consequently, in exemplary embodiments of the present invention, time required for a read operation may be reduced even when a cycling number increases.

Figure 10:
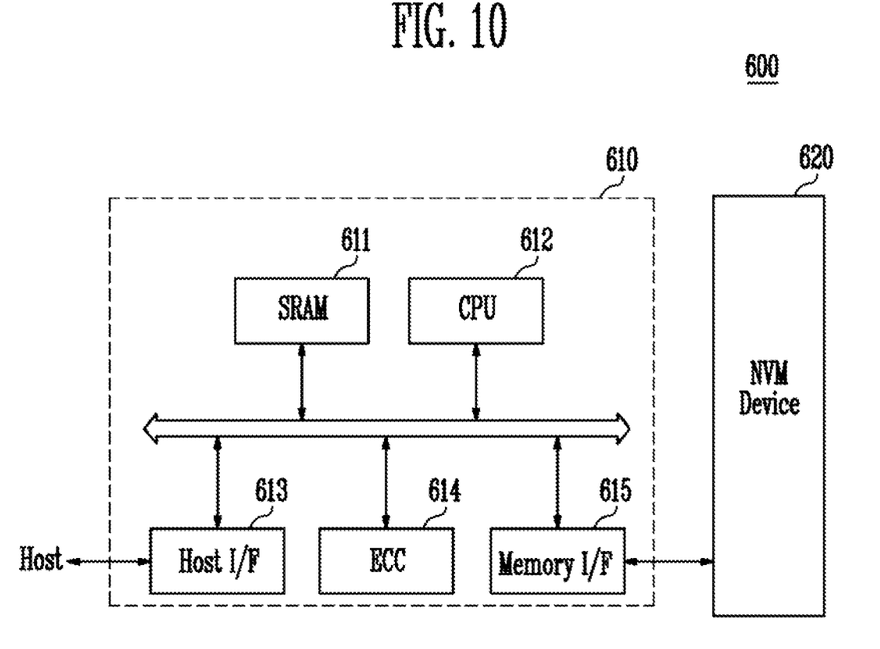
FIG. 10 is a schematic block diagram illustrating a memory system according to an exemplary embodiment of the present invention.

FIG. 10 is a schematic block diagram of a memory system according to an exemplary embodiment of the present invention.

Referring to FIG. 10, the memory system 600 includes a non-volatile memory device 620 and a memory controller 610.

The non-volatile memory device 620 may be constituted as the semiconductor memory device described above. The memory controller 610 is configured to control the non-volatile memory device 620. A combination of the non-volatile memory device 620 and the memory controller 610 may be provided as a memory card or a semiconductor disk device, such as solid state disk (SSD). A static random access memory (SRAM) 611 is used as an operation memory of a processing unit 612. A host interface 613 has a data exchange protocol of a host connected with the memory system 600. An error correction block 614 detects and corrects errors included in data read from the non-volatile memory device 620. A memory interface 615 interfaces with the non-volatile memory device 620. The processing unit 612 performs all control operations for data exchange of the memory controller 610.

Although not shown in FIG. 10, it may be apparent to those with ordinary skill in the art that the memory system 600 may further include a read only memory (ROM) storing code data for interfacing with the host. The non-volatile memory device 620 may be provided as a multi-chip package consisting of a plurality of flash memory chips. The memory system 600 may be provided as a storage medium with a low error rate and high reliability. In particular, a flash memory device may be included in the memory system such as the SSD that is actively researched. In this case, the memory controller 610 may be configured to communicate with the outside (e.g., host) through one of various interface protocols such as Universal Serial Bus (USB), MultiMediaCard (MMC), Peripheral Component Interconnect-Express (PCI-E), Serial Advanced Technology Attachment (SATA), Parallel ATA (DATA), Small Computer System Interface (SCSI), Enhanced Small Disk Interface (ESDI), and Integrated Drive Electronics (IDE).

Figure 11:
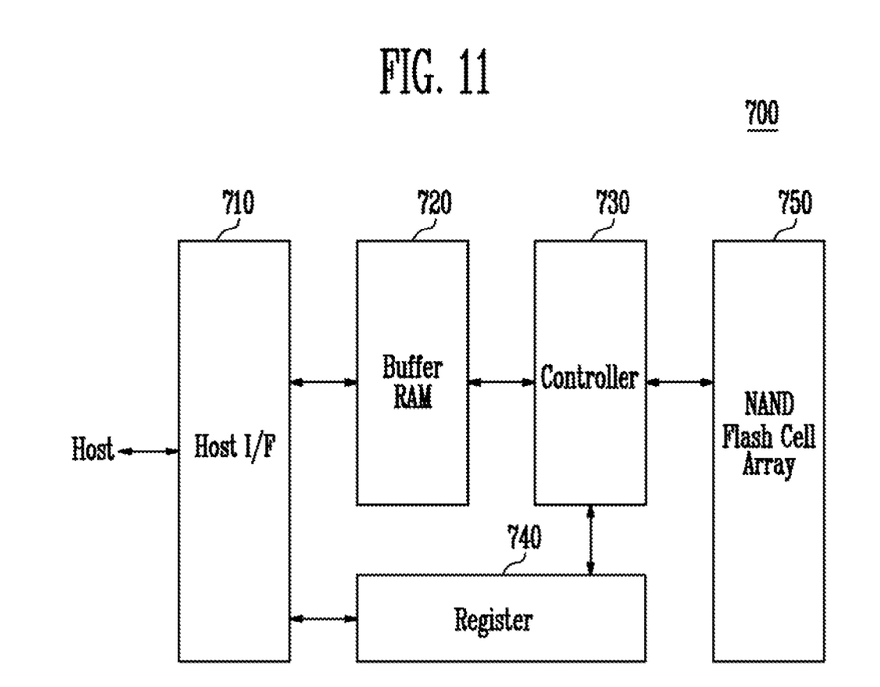
FIG. 11 is a schematic block diagram illustrating a fusion memory device or a fusion memory system that performs a program operation according to an exemplary embodiments of the present invention.

FIG. 11 is a schematic block diagram of a fusion memory device or a fusion memory system that performs a program operation according to the above-described various exemplary embodiments. For example, technological features of the present invention may be applied to an OneNAND flash memory 700 as a fusion memory device.

The OneNAND flash memory 700 includes a host interface 710 that exchanges various pieces of information with a device that uses a different protocol than the memory device 700, a buffer RAM 720 that stores a code for driving the OneNAND flash memory 700 or temporarily stores data, a controller 730 that controls reading, programming, and all states in response to a control signal and command received from the outside, a register 740 in which data such as a command, an address, and a configuration that defines a system operation environment in the memory device 700 is stored, and a NAND flash cell array 750 that has a ion-volatile memory cell and an operation circuit including a page buffer. In response to a write request from a host, the OneNAND flash memory 700 programs data in the above-described method.

Figure 12:
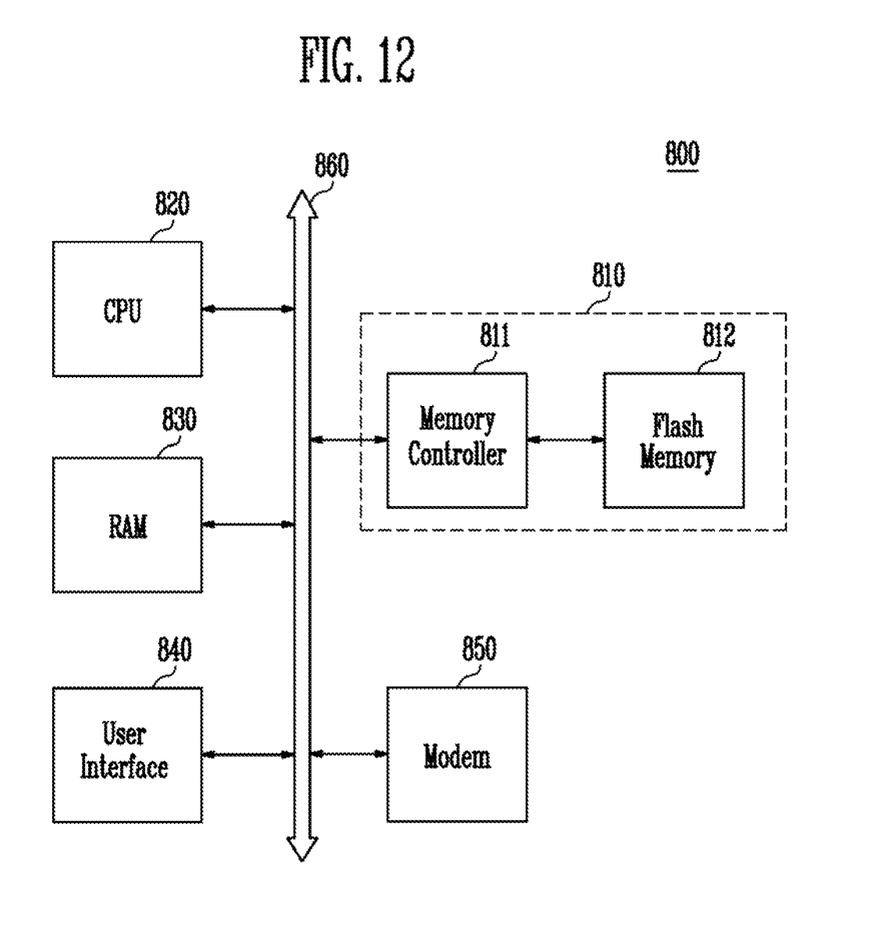
FIG. 12 is a schematic block diagram illustrating a computing system including a flash memory device according to an exemplary embodiment of the present invention.

FIG. 12 is a schematic block diagram of a computing system including a flash memory 812 according to an exemplary embodiment of the present invention.

A computing system 800 according to an exemplary embodiment of the present invention includes a microprocessor 820, a RAM 830, a user interface 840, a model 850 such as a baseband chipset, and a memory system 810. When the computing system 800 is a mobile device, a battery (not shown) for supplying operating voltage to the computing system 800 may be additionally provided. Although not shown in FIG. 12, it may be apparent to those of ordinary skill in the art that the computing system 800 may further include an application chipset, a camera image processor (CIS), a mobile dynamic random access memory (DRAM), and so on. The memory system 810 may include, for example, the SSD that uses a non-volatile memory to store data. Alternatively, the memory system 810 may be provided as a fusion flash memory (e.g., OneNAND flash memory).

The above-described exemplary embodiments of the present invention are implemented not only through an apparatus and method but also through a program that realizes functions corresponding to the exemplary embodiments of the present invention or a recording medium in which the program is recorded. The above description of the exemplary embodiments facilitates such implementation by those of ordinary skill in the art to which the present invention pertains.

In exemplary embodiments of the present invention, a read retry number is stored in spare cells while data is read from main cells, such that time required for a read operation may be reduced, and the reliability of data may be improved.

While the invention has been shown and described with reference to certain exemplary embodiments thereof, it, will be understood by those skilled in the art that various changes in form and details may be made therein without departing from the spirit and scope of the invention as defined by the appended claims.

What is claimed is:

1. An operating method of a semiconductor memory device, comprising:
   performing a first read operation on main cells of a first page with an initial read voltage;
   performing a second read operation on the main cells of the first page with a read voltage corresponding to a read retry number when a number of error bits generated as results of performing the first read operation exceeds a number of error-correctable bits;
   storing the read retry number in spare cells of the first page while the second read operation is performed; and
   repeating the performing the second read operation and the storing the read retry number until a number of error bits generated as results of performing the second read operation becomes the number of error-correctable bits or less.

2. The operating method of claim 1, further comprising performing a read operation on main cells of a second page with a read voltage corresponding to a read retry number stored after repeatedly performing the second read operation and repeatedly storing the read retry number.

3. The operating method of claim 1, further comprising:
   reading a read retry number stored in the spare cells of the first page; and
   performing a read operation on main cells of a second page with a read voltage corresponding to the read retry number.

4. The operating method of claim 3, wherein reading the read retry number stored in the spare cells of the first page is performed when the semiconductor memory device is powered on.

5. The operating method of claim 1, wherein storing the read retry number in the spare cells of the first page while the second read operation is performed includes supplying a lower voltage than the read voltage to bit lines of the spare cells to store the read retry number in the spare cells.

6. An operating method of a semiconductor memory device, comprising:
   performing a read operation on spare cells of a first page with a reference read voltage to read a read retry number from the spare cells;
   performing a read operation on main cells of the first page with a first read voltage determined based on the read retry number to read data from the main cells;
   updating the read retry number when a number of error bits of the data exceeds a number of error-correctable bits; and
   performing a read operation on the main cells of the first page with a second read voltage determined based on the updated read retry number to read the data from the main cells.

7. The operating method of claim 6, wherein storing the updated read retry number in the spare cells of the first page is performed while the data is read with the second read voltage determined based on the updated read retry number.

8. The operating method of claim 7, wherein a voltage lower than the second read voltage is supplied to bit lines of the spare cells of the first page while the data is read with the second read voltage determined based on the updated read retry number, to store the updated read retry number in the spare cells of the first page while the data is read with the second read voltage determined based on the updated read retry number.

9. The operating method of claim 6, further comprising repeatedly updating the read retry number and repeatedly reading the data with a read voltage determined based on the updated read retry number until the number of error bits of the data becomes the number of error-correctable bits or less.

10. The operating method of claim 9, further comprising performing a read operation on main cells of a second page with a read voltage determined by repeatedly updating the read retry number and repeatedly reading the data with the read voltage determined according to the updated read retry number.

11. The operating method of claim 9, wherein the updated read retry number is stored in the spare cells of the first page while the data is read with the read voltage determined based on the updated read retry number.

12. The operating method of claim 11, wherein a voltage lower than the read voltage is supplied to bit lines of the spare cells of the first page while the data is read with the read voltage determined based on the updated read retry number, to store the updated read retry number in the spare cells of the first page while the data is read with the read voltage determined based on the updated read retry number.

13. The operating method of claim 6, wherein reading the read retry number of the first page is performed when the semiconductor memory device is powered on.

14. A semiconductor memory device, comprising:
    a memory array including main cells for storing data and spare cells for storing a read retry number;
    a page buffer configured to read the data or the read retry number;
    an error corrector configured to correct an error of the read data; and
    a voltage supplier configured to supply a read voltage set based on the read retry number to the memory array,
    wherein when the error corrector determines that the read data is failed, the voltage supplier updates the read retry number to reset the read voltage, and
    the page buffer stores the updated read retry number in the spare cells.

15. The semiconductor memory device of claim 14, wherein the voltage supplier supplies the reset read voltage to the memory array, and
    the page buffer reads the data with the reset read voltage.

16. The semiconductor memory device of claim 15, wherein the page buffer stores the updated read retry number in the spare cells while reading the data with the reset read voltage.

17. The semiconductor memory device of claim 16, wherein the page buffer supplies a voltage lower than the reset read voltage to bit lines of the spare cells to store the updated read retry number in the spare cells while reading the data with the reset read voltage.

18. The semiconductor memory device of claim 14, wherein the page buffer stores an updated read retry number in the spare cells when the error corrector determines that the read data is passed.

19. The semiconductor memory device of claim 18, wherein the page buffer reads the read retry number when the semiconductor memory device is powered on.

20. The semiconductor memory device of claim 14, wherein, when a number of error bits of the read data exceeds a number of correctable bits, the error corrector determines that the read data is failed and outputs a fail signal to the voltage supplier, and the voltage supplier updates the read retry number in response to the fail signal.

* * * * *